United States Patent
Gardner et al.

(10) Patent No.: US 6,373,113 B1
(45) Date of Patent: *Apr. 16, 2002

(54) NITROGENATED GATE STRUCTURE FOR IMPROVED TRANSISTOR PERFORMANCE AND METHOD FOR MAKING SAME

(75) Inventors: Mark I. Gardner, Cedar Creek; Mark C. Gilmer, Austin, both of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/073,755

(22) Filed: May 6, 1998

Related U.S. Application Data

(62) Division of application No. 08/763,240, filed on Dec. 10, 1996, now Pat. No. 5,783,469.

(51) Int. Cl.[7] .................. H01L 29/76; H01L 29/94; H01L 31/062; H01L 31/113; H01L 31/119
(52) U.S. Cl. .................. 257/411; 257/410; 257/412; 257/344; 257/369
(58) Field of Search .................. 257/410, 411, 257/412, 639, 649, 914, 344, 408, 369, 336, 59, 422, 371, 377, 754; 438/585, 592, 231

(56) References Cited

U.S. PATENT DOCUMENTS

| | | | |
|---|---|---|---|
| 4,525,920 A | 7/1985 | Jacobs et al. | 29/571 |
| 4,613,885 A | 9/1986 | Haken | 357/42 |
| 4,755,865 A | 7/1988 | Wilson et al. | 257/754 |
| 4,774,197 A | 9/1988 | Haddad et al. | 437/37 |
| 4,818,714 A * | 4/1989 | Haskell | 257/344 |
| 5,189,504 A | 2/1993 | Nakayama et al. | 257/422 |

(List continued on next page.)

OTHER PUBLICATIONS

Kuroi, et al., "Novel NICE (Nitrogen Implantation into CMOS Gate Electrode and Source–Drain) Structure for High Reliability and High Performance 0.25 μm Dual Gate CMOS," IEDM 1993, pp. 13.2.1–13.2.4.

*Primary Examiner*—Steven Loke
(74) *Attorney, Agent, or Firm*—Kevin L. Daffer; Conley, Rose & Tayon P.C.

(57) ABSTRACT

An integrated circuit is provided in which nitrogen is incorporated into the gate dielectric and transistor gate. A method for forming the integrated circuit preferably comprises the providing of a semiconductor substrate that has a p-well and a laterally displaced n-well, each including a channel region laterally displaced between a pair of source/drain regions. Preferably, the semiconductor substrate has a resistivity of approximately 10 to 15 Ω-cm. A dielectric layer is formed on an upper surface of the semiconductor substrate. The formation of the dielectric layer preferably comprises a thermal oxidation performed at a temperature of approximately 600 to 900° C. and the resulting thermal oxide has a thickness less than approximately 50 angstroms. A conductive gate layer is then formed on the dielectric layer. In a preferred embodiment, the conductive gate layer is formed by chemically vapor depositing polysilicon at a pressure of less than approximately 2 torrs at a temperature in the range of approximately 500 to 650° C. A nitrogen bearing impurity distribution is then introduced into the conductive gate layer and the dielectric layer. The introduction of the nitrogen bearing impurity distribution is suitably accomplished by implanting a nitrogen bearing molecule such as N, $N_2$, NO, $NF_3$, $N_2O$, $NH_3$, or other nitrogen bearing molecule. Ideally, a peak concentration of the nitrogen bearing impurity distribution is in the range of approximately $1\times10^{15}$ to $1\times10^{19}$ atoms/cm$^3$ and is located proximal to an interface of the conductive gate layer and the dielectric layer. Thereafter, an anneal may be performed, preferably in a rapid thermal process, at a temperature of approximately 900 to 1100° C. for a duration of less than 5 minutes.

9 Claims, 2 Drawing Sheets

U.S. PATENT DOCUMENTS

| | | | |
|---|---|---|---|
| 5,468,666 A | 11/1995 | Chapman | 437/44 |
| 5,489,542 A * | 2/1996 | Iwai et al. | 257/411 |
| 5,508,532 A | 4/1996 | Teramoto | 257/59 |
| 5,554,871 A | 9/1996 | Yamashita et al. | 257/336 |
| 5,567,638 A | 10/1996 | Lin et al. | 438/592 |
| 5,808,348 A * | 9/1998 | Ito et al. | 257/410 |
| 5,872,049 A * | 2/1999 | Gardner et al. | 438/585 |
| 5,885,861 A | 3/1999 | Gardner et al. | 438/231 |

* cited by examiner

NITROGENATED GATE STRUCTURE FOR IMPROVED TRANSISTOR PERFORMANCE AND METHOD FOR MAKING SAME

This application is a Division of application Ser. No. 08/763,240, filed Dec. 10, 1996, now U.S. Pat. No. 5,783,469.

BACKGROUND OF THE INVENTION

1. Field of the Invention

This invention relates to semiconductor fabrication and more particularly to an improved method for forming a transistor by incorporating nitrogen into the transistor gate and gate dielectric.

2. Description of the Relevant Art

The conventional fabrication of MOS (metal-oxide-semiconductor) transistors within a semiconductor substrate is well known. Typically, the substrate is divided into a plurality of active regions and isolation regions through an isolation process such as field oxidation or shallow trench isolation. After the isolation and active regions have been formed, the active regions may be further divided into n-well active regions and p-well active regions by implanting n-type dopants and p-type dopants into their respective wells. A thin oxide is then grown on an upper surface of the semiconductor substrate in the active regions. This thin oxide serves as the gate oxide for subsequently formed transistors. Thereafter, a plurality of polysilicon gate structures are formed wherein each polysilicon gate traverses an active region, effectively dividing the active region into a pair of source/drain regions disposed on either side of each gate structure and a channel region disposed below each gate structure. After formation of the polysilicon gates, a p-type source/drain implant is performed to introduce p-type impurities into the source/drain regions of the n-wells and an n-type source/drain implant is performed to introduce n-type impurities into the source/drain regions of the p-wells. The dopant species used in conventional transistor processing typically includes phosphorus and arsenic for n-type impurities and boron for p-type impurities.

As transistor geometries shrink below 0.5 micron, the limitations of conventional transistor processing become more and more apparent. As the thickness of the gate oxide decreases below 100 angstroms, devices become more susceptible to diffusion of impurities contained within the gate structure across the gate oxide and into the active area of the transistor. This problem is especially acute for gate structures into which boron is implanted (e.g., p+ polysilicon gates) because of the relatively high rate at which boron diffuses through silicon and silicon dioxide. In addition, it is believed that many loosely formed bonds exist at the interface between the gate oxide structure and the polysilicon gate structure in conventionally formed transistors. The presence of these loosely formed bonds is believed to contribute to undesirable transistor characteristics such as susceptibility to voltage breakdown. Still further, as devices become smaller and more densely packed upon a semiconductor substrate surface, it becomes increasingly important to minimize the leakage current of each individual transistor. It is believed that leakage current can be created by a scattering effect that occurs as electrons traverse the channel between a device's source region and drain region. As the number of transistor devices within a single integrated circuit increases, leakage current can become significant enough to raise the temperature of the semiconductor substrate, slowing the device and, eventually, raising the temperature above the operational limit of the device.

Therefore, it would be highly desirable to fabricate MOS transistors in a manner that reduces or eliminates diffusion from a gate structure to an underlying active region of the transistor; improves the bond structure of the polysilicon gate oxide interface, thereby improving the characteristics of the interface; and increases the source/drain drive current without a corresponding increase in leakage current.

SUMMARY OF THE INVENTION

The problems outlined above are in large part addressed by a method of fabricating an integrated circuit in which nitrogen is incorporated into the gate dielectric and transistor gate. The nitrogen in the silicon gate is believed to facilitate the formation of stronger bonds with the underlying dielectric, preferably an oxide, resulting in improved transistor characteristics including higher gate oxide breakdown voltages. The presence of nitrogen within the gate structure also inhibits the diffusion of impurities, particularly boron, from the gate structure into the active region of the underlying transistor. The reduction of dopant diffusion across the gate dielectric enables the formation of devices with thinner gate oxides and, therefore, superior operating characteristics.

Broadly speaking, the present invention contemplates a method of fabricating an integrated circuit. The method comprises the providing of a semiconductor substrate that has a p-well region and an n-well region. The n-well region is laterally displaced from the p-well region. The n-well and the p-well each include a channel region laterally displaced between a pair of source/drain regions. Preferably, the semiconductor substrate includes a p-type epitaxial layer having a resistivity of approximately 10 to 15 $\Omega$-cm formed on a p+silicon bulk. A dielectric layer is formed on an upper surface of the semiconductor substrate. The formation of the dielectric layer preferably comprises a thermal oxidation performed at a temperature of approximately 600 to 900° C. and the resulting thermal oxide has a thickness less than approximately 50 angstroms. A conductive gate layer is then formed on the dielectric layer. In a preferred embodiment, the conductive gate layer is formed by chemically vapor depositing polysilicon at a pressure of less than approximately 2 torrs at a temperature in the range of approximately 500 to 650° C. A nitrogen-bearing impurity distribution is then introduced into the conductive gate layer and the dielectric layer. The introduction of the nitrogen-bearing impurity distribution is suitably accomplished by implanting a nitrogen-bearing molecule such as N, $N_2$, NO, $NF_3$, $N_2O$, or $NH_3$. Ideally, a peak concentration of the nitrogen-bearing impurity distribution is in the range of approximately $1 \times 10^{15}$ to $1 \times 10^{19}$ atoms/cm$^3$ and is located proximal to an interface of the conductive gate layer and the dielectric layer. Thereafter, an anneal may be performed, preferably in a rapid thermal process, at a temperature of approximately 900 to 1100° C. for a duration of less than approximately 5 minutes. The conductive gate layer is patterned to form first and second conductive gate structures over the channel regions of the p-well and n-well respectively. Thereafter a first n-channel source/drain impurity distribution may be introduced into the source/drain regions of the p-well and a first p-channel source/drain impurity distribution may be introduced into the source/drain regions of the n-well.

The present invention further contemplates an integrated circuit. The integrated circuit includes a semiconductor substrate, preferably comprising silicon, having a p-well and a laterally displaced n-well. A dielectric layer is located on an upper surface of the semiconductor substrate. The dielectric layer includes an impurity distribution comprising a nitrogen-bearing molecule such as NO, $NF_3$, $N_2O$, or $NH_3$. Preferably, the dielectric layer is a thermal oxide having a thickness of less than approximately 50 angstroms. The integrated circuit further includes a first and a second gate structure formed on the dielectric layer over respective channel regions in the n-well and p-well. Like the dielectric layer, the gate structures include a nitrogen bearing impurity distribution. The gate structures preferably comprise polysilicon having a sheet resistivity less than approximately 500 Ω/square. A first source/drain impurity distribution is substantially contained within a first pair of source/drain regions laterally displaced on either side of the first channel region while a second source/drain impurity distribution is substantially contained within a second pair of source/drain regions laterally displaced on either side of the second channel region. The first source/drain impurity distribution is n-type, preferably comprising ions of phosphorous or arsenic, and the second source/drain impurity distribution is p-type, preferably comprising ions of boron. A peak impurity concentration of the first and second source/drain impurity distributions is preferably greater than approximately $1\times10^{19}$ atoms/$cm^3$.

The present invention still further contemplates a semiconductor fabrication process in which a semiconductor substrate, preferably comprising single crystalline silicon, is provided. A dielectric layer is formed on an upper surface of the semiconductor substrate. A conductive gate layer is then deposited on the dielectric layer. Thereafter, a nitrogen bearing impurity distribution is simultaneously introduced into the dielectric layer and the conductive gate. In the preferred embodiment, the semiconductor substrate includes a p-type epitaxial layer formed on a p+ silicon bulk. The resistivity of the epitaxial layer is preferably in the range of approximately 10 to 15 Ω-cm. The dielectric layer is preferably formed by thermally oxidizing the semiconductor substrate in an oxygen-bearing ambient at a temperature of approximately 600 to 900° C. to form a thermal dielectric. The thickness of the thermal dielectric is preferably less than approximately 50 angstroms. The conductive gate layer is preferably formed by depositing polysilicon at a pressure of less than approximately 2 torrs and at a temperature of approximately 500 to 650° C.

BRIEF DESCRIPTION OF THE DRAWINGS

Other objects and advantages of the invention will become apparent upon reading the following detailed description and upon reference to the accompanying drawings in which.

Figure 1:
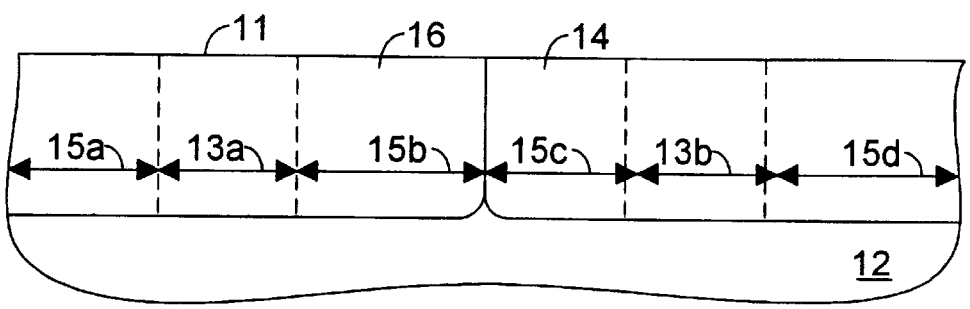
FIG. 1 is a partial cross-sectional view of a semiconductor substrate having a p-well and a laterally displaced n-well region contained therein.

While the invention is susceptible to various modifications and alternative forms, the specific embodiments hereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4:
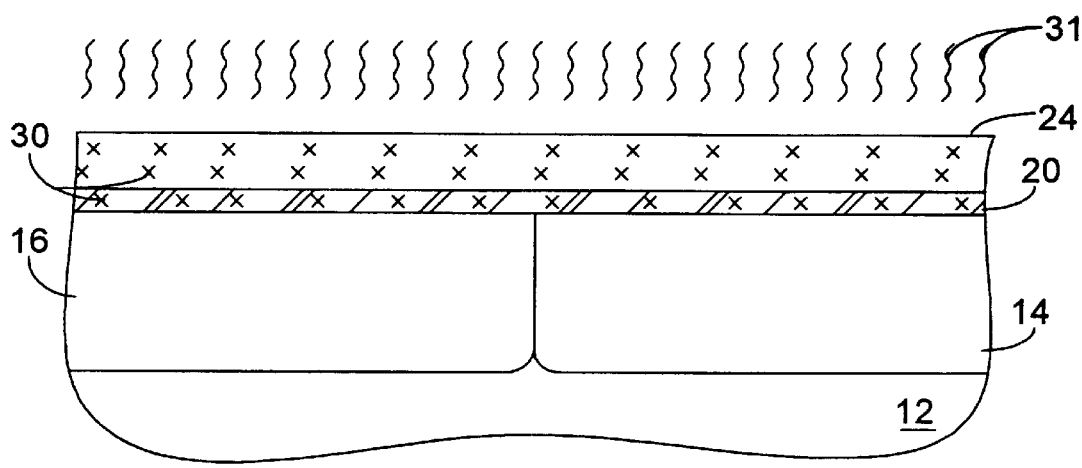
FIG. 4 is a partial cross-sectional view subsequent to FIG. 3 depicting the nitrogen incorporated into the polysilicon layer.
Figure 5:
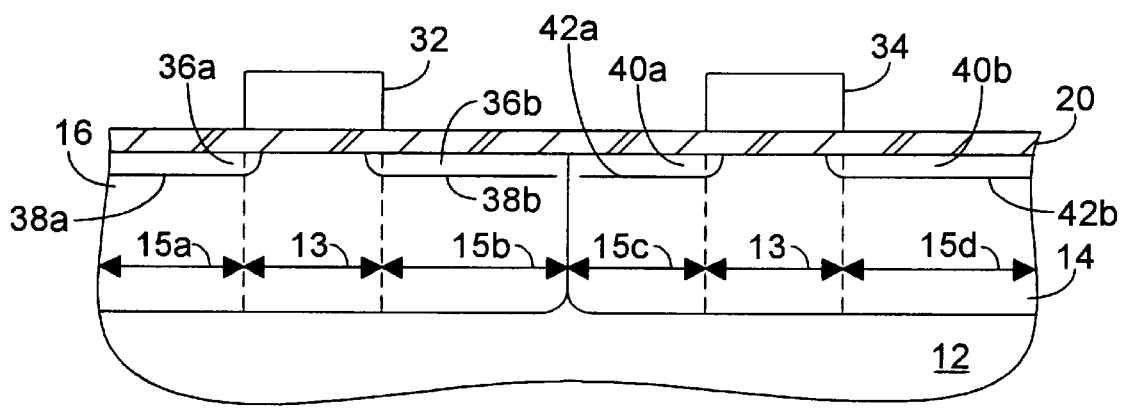
FIG. 5 is a processing step subsequent to FIG. 4 in which the conductive gate layer has been patterned on the dielectric layer to form first and second gate structures and lightly doped impurity distributions have been introduced in lightly doped source/drain regions within the semiconductor substrate.
Figure 6:
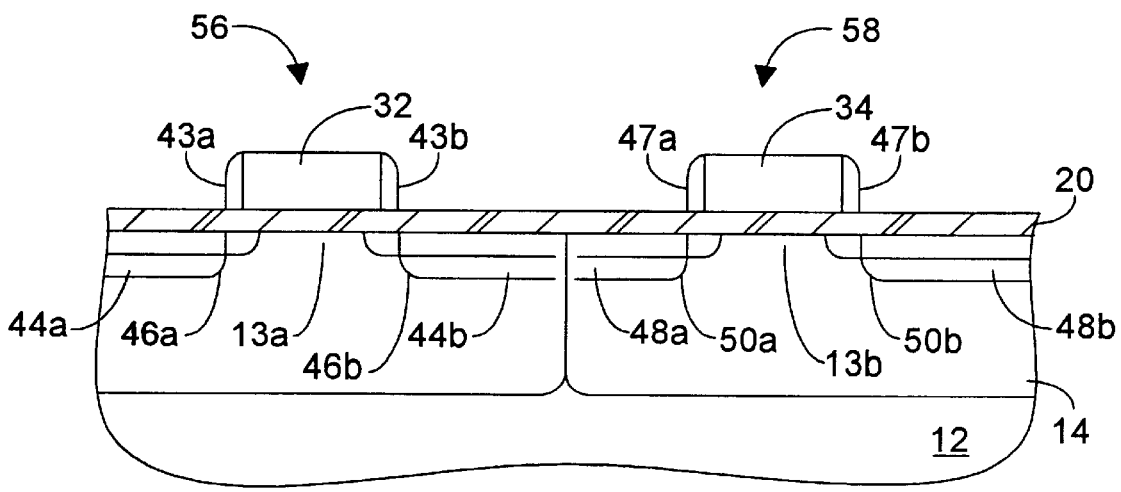
FIG. 6 is a processing step subsequent to FIG. 5 in which spacer structures are formed on sidewalls of the first and second gate structures.

Turning now to the drawings, FIGS. 1–6 depict one embodiment of a semiconductor fabrication process for forming integrated circuit 60 (shown in FIG. 6). Integrated circuit 60 includes first transistor 56 and second transistor 58 formed within p-well 16 and n-well 14 respectively of semiconductor substrate 12. Integrated circuit 60 includes a dielectric layer 20 formed on upper surface 11 of semiconductor substrate 12. First transistor 56 includes a first conductive gate structure 32 formed on dielectric layer 20. Conductive gate structure 32 is formed over first channel region 13a of semiconductor substrate 12. First channel region 13a is laterally disposed between a first pair of source/drain regions 46a and 46b. First transistor 56 further includes a first source/drain impurity distribution 44 that is substantially contained within the pair of first source/drain regions 46a and 46b. Similarly, second transistor 58 includes a second conductive gate structure 34 formed on dielectric layer 20. Second conductive gate structure 34 is formed over second channel region 13b of semiconductor substrate 12. Second channel region 13b is laterally disposed between a second pair of source/drain regions 50a and 50b. Second transistor 58 further includes a second source/drain impurity distribution 48 that is substantially contained within the pair of second source/drain regions 50a and 50b. A nitrogen-bearing impurity distribution 30 (shown in FIG. 4) is included within first gate structure 32, second gate structure 34, and dielectric layer 20.

The preferred starting material for semiconductor substrate 12 includes a p-type epitaxial layer having a resistivity in the approximate range of 10 to 15 Ω-cm formed upon a p+ silicon bulk (i.e., a silicon bulk having a p-type impurity distribution greater than approximately $10^{19}$ atoms/$cm^3$.) Dielectric layer 20 is preferably a thermal oxide having a thickness of less than approximately 50 angstroms. A preferred material for first and second conductive gate structures 32 and 34 is heavily doped polysilicon (i.e., polysilicon having a sheet resistivity less than approximately 500 Ω/square). In the embodiment shown in FIG. 6, integrated circuit 60 further includes a first lightly doped impurity distribution 36 substantially contained within a first pair of lightly doped regions 38a and 38b and a second lightly doped impurity distribution 40 substantially contained within a second pair of lightly doped regions 42a and 42b. First pair of spacer structures 43a and 43b formed on sidewalls of first conductive gate 32 and second pair of spacer structures 47a and 47b formed on sidewalls of second conductive gate structure 34 are used in the preferred embodiment to laterally displace the source/drain regions 46a, 46b, 50a, and 50b from positions laterally aligned with the respective sidewalls of first and second conductive gate structures 32 and 34. The use of lightly doped impurity regions and laterally displaced source/drain regions such as is shown in FIG. 6 is known to reduce the maximum electric field occurring within substrate 12, thereby reducing undesirable short channel effects.

FIGS. 1 through 6 depict a preferred processing sequence for forming integrated circuit 60. In FIG. 1, semiconductor substrate 12 is provided. A preferred starting material for semiconductor substrate 12 is a p-type epitaxial layer that extends to upper surface 11 of semiconductor substrate 12. The epitaxial layer is formed on a heavily doped p+ silicon bulk. A starting resistivity for the epitaxial layer is in the range of approximately 10 to 15 Ω-cm and is still more preferably equal to approximately 12 Ω-cm. Semiconductor substrate 12 includes a p-well 16 which is laterally displaced from n-well 14. The formation of p-well 16 and n-well 14 within semiconductor substrate 12 is accomplished with well-known processing steps including one or possibly two masking steps, a pair of well implants, and possibly a diffusion or rapid thermal process to drive the respective well impurity distributions to desired depths. A boron implant is preferred for p-well 16 while a phosphorous implant is preferred for n-well 14. The p-well 16 defines regions in which n-channel transistors such as first transistor 56 (shown in FIG. 6) will subsequently be formed while n-well 14 defines regions into which p-channel transistors such as second transistor 58 will subsequently be formed. P-well 16 includes first channel region 13a laterally disposed between a pair of implant regions 15a and 15b while n-well 14 includes a second channel region 13b formed between a second pair of implant regions 15c and 15d.

Figure 2:
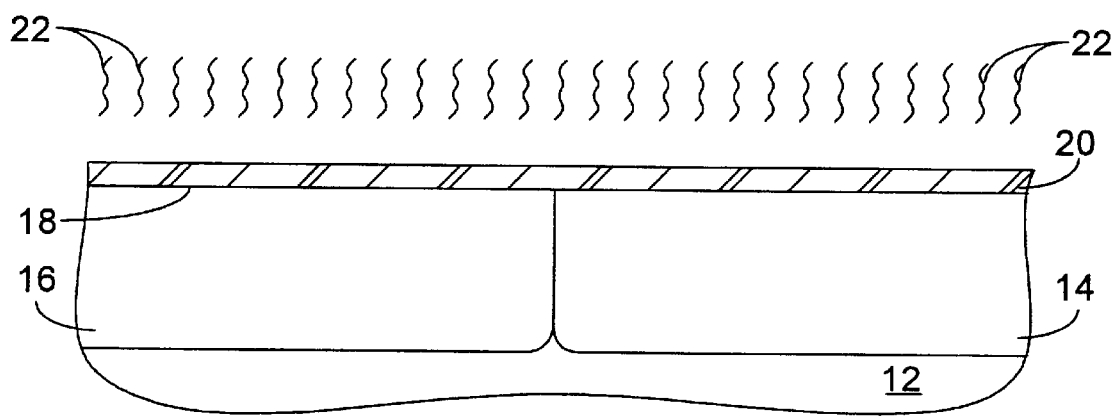
FIG. 2 is a processing step subsequent to FIG. 1 in which a dielectric layer is thermally formed on an upper surface of the semiconductor substrate.

Turning now to FIG. 2, a dielectric layer 20 is formed on an upper surface 11 of semiconductor substrate 12. Preferably, dielectric layer 20 is formed with a thermal oxidation process step represented in the drawing as reference numeral 22. In the preferred thermal oxidation process, semiconductor substrate 12 is subjected to an oxygen-bearing ambient maintained at a temperature between approximately 600 to 900° C. for a duration of 2 to 20 minutes. A preferred thickness of dielectric layer 20 is less than 50 angstroms. The thermal oxidation process can be carried out in a batch process thermal oxidation tube as is well known. Alternatively, a rapid thermal process may be used to form dielectric layer 20. In a typical rapid thermal process, a single semiconductor substrate is heated to an oxidizing temperature for a relatively short duration (e.g., less than 5 minutes). As will be described in more detail below, dielectric layer 20 will serve as a gate dielectric for transistors formed subsequently.

Figure 3:
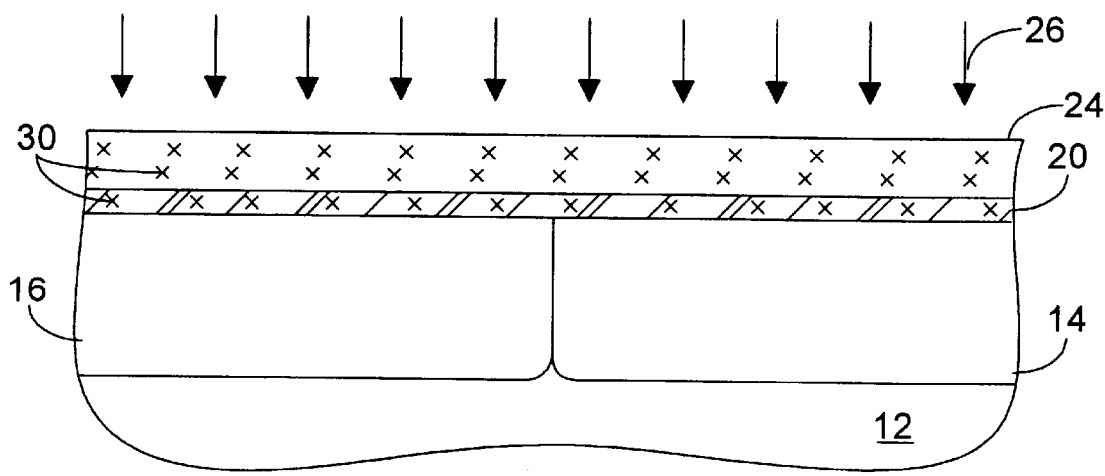
FIG. 3 is a processing step subsequent to FIG. 2 in which a conductive gate layer is formed on the dielectric layer and a nitrogen-bearing impurity distribution species is introduced into the dielectric layer and the conductive gate layer.

Turning now to FIG. 3, a processing step subsequent to FIG. 2 is shown in which a conductive gate layer 24 has been formed on the dielectric layer 20. In the presently preferred embodiment, conductive gate layer 24 comprises heavily doped polysilicon. In alternative embodiments not shown, conductive gate layer 24 may comprise a composite including polysilicon, aluminum, tungsten, titanium, or other suitable conducting material. The formation of conductive gate layer 24 preferably includes a chemical vapor deposition of polysilicon at a pressure of less than approximately 2 torrs and at temperature maintained between approximately 500 to 650° C. The resistivity of conductive gate layer 24 is preferably reduced to less than approximately 500 Ω/square by introducing an impurity distribution into conductive gate layer 24. In one preferred process, the introduction of this impurity distribution is accomplished with an ion implantation of phosphorous, arsenic, or boron. FIG. 3 further shows the introduction of a nitrogen-bearing impurity distribution 30 into conductive gate layer 24 and dielectric layer 20 through the use of ion implant 26. Implant 26 may be accomplished with a number of alternative nitrogen-bearing molecules such as N, $N_2$, NO, $NF_3$, $N_2O$, or $NH_3$. In a presently preferred embodiment, the implant dose and energy are adjusted such that a peak nitrogen concentration within conductive layer 24 is proximal (i.e., less than 200 angstroms from) the interface between gate dielectric 20 and conductive gate layer 24 and such that nitrogen impurity distribution 30 is spread throughout conductive gate layer 24 and dielectric layer 20. A preferred peak nitrogen concentration for nitrogen impurity distribution is in the range of approximately $10^{15}$ to $10^{19}$ atoms/cm$^3$. In FIG. 4, an optional anneal cycle, represented as reference numeral 31 in the drawing, may be performed to repair damage to conductive gate layer 24 and gate dielectric 20 resulting from implant 26. A rapid thermal process, in which semiconductor substrate 12 is raised to a temperature of approximately 900 to 1100° C. for a duration less than approximately 5 minutes is the preferred method for anneal 31. Alternatively, anneal cycle 31 may be accomplished in a diffusion tube using an inert ambient such as argon.

Turning now to FIG. 5, polysilicon layer 24 is patterned to form first gate structure 32 and second gate structure 34. First gate 32 and second gate 34 are patterned to coincide with first and second channel regions 13a and 13b respectively within p-well 16 and n-well 14. Patterning of conductive gate layer 24 is preferably accomplished with conventional photolithography and etch techniques. In the embodiment shown in FIG. 5, a first lightly doped impurity distribution 36 is then introduced into a first pair of lightly doped regions 38a and 38b and a second lightly doped impurity distribution 40 is introduced into a second pair of lightly doped regions 42a and 42b. The lightly doped impurity distributions 36 and 40 are preferably introduced into semiconductor substrate 12 with a low energy implant (i.e., implant energy less than approximately 50 keV) and are designed to reduce short channel effects by reducing the maximum electric field proximal to the channel regions 13a and 13b.

Turning to FIG. 6, a first pair of spacer structures 43a and 43b and a second pair of spacer structures 47a and 47b have been formed on sidewalls of first and second conductive gate structures 32 and 34 respectively. The spacer structures are preferably formed by the well-known process in which a conformal dielectric layer (preferably an oxide) is deposited over the substrate topography. A low pressure (i.e., less than 2 torrs) chemical vapor deposition reactor is suitably used for the formation of this conformal dielectric. An anisotropic dry etch process is then performed with a minimum overetch to remove the deposited dielectric from horizontal regions of the topography, leaving behind spacer structures 43a, 43b, 47a, and 47b at the completion of the etch process. Subsequent to the formation of the spacer structures, a first source/drain impurity distribution 44 and a second source/drain impurity distribution are introduced into p-well 16 and n-well 14 of semiconductor substrate 12 respectively. First source/drain impurity distribution 44 is substantially contained within first pair of source/drain impurity regions 46a and 46b respectively while second source/drain impurity distribution 48 is substantially contained within second pair of source/drain regions 50a and 50b. First pair of source/drain regions 46a and 46b are laterally displaced on either side of first channel region 13a within p-well 16. Second pair of source/drain regions 50a and 50b are laterally displaced on either side of second channel region 13b within n-well 14. First source/drain impurity distribution 44 comprises an n-type impurity such as phosphorous or arsenic while second source/drain impurity distribution 48 comprises a p-type impurity such as boron. A preferred concentration of first and second source/drain impurity distributions is greater than approximately $10^{19}$ atoms/cm$^3$.

As will be obvious to one skilled in the art having the benefit of this disclosure, the process sequence described in FIGS. 1–6 is capable of producing an integrated circuit useful in preventing the diffusion of impurities from the gate structures into the active regions through the gate dielectric. It will be still further appreciated that by incorporating nitrogen into the source/drain regions, the active current is increased without substantially increasing the leakage current. It will be still further appreciated that because the nitrogenated gate regions tend to form stronger bonds with the underlying gate dielectric, that the quality of the polysilicon-SiO$_2$ interface is improved.

It is to be understood that the form of the invention shown and described in the detailed description and the drawings is to be taken merely as presently preferred examples of how nitrogen can be incorporated into, the source/drain regions and the gate structure of a MOS type transistor. Obvious variations of the method disclosed would be apparent to those skilled in the art having the benefit of this disclosure. It is intended that the following claims be interpreted broadly to embrace all the variations of the preferred embodiments disclosed.

What is claimed is:

1. An integrated circuit comprising:

a semiconductor substrate comprising an n-well and a p-well, wherein said n-well is laterally displaced from said p-well;

a dielectric layer formed on an upper surface of said semiconductor substrate, wherein said dielectric layer comprises a distribution of a nitrogen bearing molecule;

a first and a second gate structure formed on said dielectric layer over a first and a second channel region of said p-well and said n-well respectively, wherein said first and second gate'structures include a nitrogen bearing impurity distribution, and wherein said dielectric layer extends beyond the lateral boundaries of the first and second gate structures and wherein said dielectric layer is continuously arranged to form the gate dielectrics of the first and second gate structures;

a first source/drain impurity distribution substantially contained within a first pair of source/drain regions laterally displaced on either side of said first channel region, wherein said first source/drain impurity distribution comprises ions selected from the group consisting of phosphorous and arsenic, and further wherein a peak impurity concentration of said first source/drain impurity distribution is greater than approximately $1\times10^{19}$ atoms/cm$^3$; and a second source/drain impurity distribution substantially contained within a second pair of source/drain regions laterally displaced on either side of said second channel region, wherein said second source/drain impurity distribution comprises boron ions, and further wherein a peak impurity concentration of said second source/drain impurity distribution is greater than approximately $1\times10^{19}$ atoms/cm$^3$.

2. The integrated circuit of claim 1 wherein said semiconductor substrate comprises silicon.

3. The integrated circuit of claim 1 wherein said dielectric layer comprises a thermal oxide and further wherein a thickness of said dielectric layer is less than approximately 50 angstroms.

4. The integrated circuit of claim 1 wherein said first and second gate structures comprise polysilicon.

5. The integrated circuit of claim 4 wherein a sheet resistivity of said polysilicon is less than approximately 500 Ω/square.

6. The integrated circuit of claim 1, wherein said dielectric layer is continuously arranged between the lateral boundaries of said first and said second gate structure.

7. The integrated circuit of claim 1, further comprising a first pair and a second pair of spacer structures adjacent to and laterally extending from sidewalls of said first and said second gate structures respectively, wherein said dielectric layer extends laterally beneath said first and said second pair of spacer structures.

8. The integrated circuit of claim 7, wherein said first and said second pairs of spacer structures are substantially free of nitrogen.

9. The integrated circuit of claim 1, wherein a bottom surface of said dielectric layer is formed upon and is coplanar with said upper surface of said semiconductor substrate.

* * * * *